United States Patent
Chen

(10) Patent No.: US 6,255,867 B1
(45) Date of Patent: Jul. 3, 2001

(54) CMOS OUTPUT BUFFER WITH FEEDBACK CONTROL ON SOURCES OF PRE-DRIVER STAGE

(75) Inventor: Baohua Chen, Mountain View, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/511,014

(22) Filed: Feb. 23, 2000

(51) Int. Cl.[7] ........................................................ H03K 3/00
(52) U.S. Cl. .................... 327/108; 327/112; 327/170; 327/437
(58) Field of Search ..................... 327/108–112, 170, 327/374, 436, 437; 326/62, 63, 68, 80–83

(56) References Cited

U.S. PATENT DOCUMENTS

| | | | |
|---|---|---|---|
| 4,859,870 | * 8/1989 | Wong et al. | 327/108 |
| 5,089,722 | 2/1992 | Amedeo | 326/87 |
| 5,218,239 | 6/1993 | Boomer | 326/27 |
| 5,378,943 | * 1/1995 | Dennard | 327/530 |
| 5,473,263 | 12/1995 | Mahmood | 326/27 |
| 5,508,635 | 4/1996 | Kwon | 326/27 |
| 5,596,297 | 1/1997 | McClure et al. | 327/538 |
| 5,629,634 | 5/1997 | Carl et al. | 326/27 |
| 5,781,034 | 7/1998 | Rees et al. | 326/86 |
| 5,786,709 | 7/1998 | Kirsch et al. | 326/27 |
| 5,804,998 | 9/1998 | Cahill et al. | 327/108 |
| 5,812,010 | 9/1998 | Houk | 327/381 |
| 5,828,233 | 10/1998 | Nguyen et al. | 326/86 |
| 5,914,617 | 6/1999 | Bartlett | 326/81 |
| 5,939,937 | 8/1999 | Terletzki | 327/541 |

* cited by examiner

*Primary Examiner*—Kenneth B. Wells
(74) *Attorney, Agent, or Firm*—Stuart T. Auvinen

(57) ABSTRACT

Ground and power-supply bounce are reduced for a CMOS output buffer. An n-channel driver transistor and a p-channel driver transistor are attached to the output pad. The gate of the n-channel driver transistor is driven by a pre-driver inverter. The pre-driver is a CMOS inverter except that the p-channel source is connected to power through a p-channel and an n-channel source-control transistor in parallel. The n-channel source-control transistor has its gate connected to power so that it remains on. The p-channel source-control transistor has its gate driven by feedback. The feedback is buffered from the output pad, or inverted from the gate of the driver transistor. When the output buffer switches, only the n-channel source-control transistor is initially on, so the current charging the driver gate is limited. The driver turns on slowly at first. Later, the feedback turns on the p-channel source-control transistor, increasing (doubling) the current to charge the driver gate. Thus the driver turns on more rapidly than at first, reducing di/dt and noise. Split driver transistors, and source control on the n-channel transistor are alternatives.

14 Claims, 6 Drawing Sheets

US 6,255,867 B1

CMOS OUTPUT BUFFER WITH FEEDBACK CONTROL ON SOURCES OF PRE-DRIVER STAGE

FIELD OF THE INVENTION

This invention relates to complementary metal-oxide-semiconductor (CMOS) integrated circuits, and more particularly to ground-bounce reduction in a CMOS output buffer.

BACKGROUND OF THE INVENTION

Digital systems often require buffers that drive large capacitive loads. Complementary metal-oxide-semiconductor (CMOS) circuits are often used in digital systems. Higher-performance systems require increased speed and current requirements for output buffers driving external loads such as busses. Higher current drive increases speed because load capacitances are more quickly charged or discharged. Unfortunately, unwanted noise is often increased too.

CMOS chips with higher-drive output buffers often produce a type of noise known as ground bounce, due to rapid changes in current through the parasitic inductances of the integrated circuit (IC) package. These inductances resist changes in current by changing the voltages on power or ground supplies. Such voltage changes can falsely trigger logic within the IC device, or other devices in the system.

The rate of voltage change of the output, the edge rate, increases for these faster devices. The high edge rate can reflect off the ends of printed-circuit-board (PCB) wiring traces driven by the output buffer. These reflections produce voltage variations known as undershoot, overshoot, and ringing (oscillation). Careful layout of these wiring traces is needed to minimize trace-ends that can cause reflections. Termination devices such as resistors to ground at the ends of the traces are often used to absorb the reflection-causing wave front produced by the high edge rate.

Dampening resistors are sometimes used. Dampening resistors are resistors in series on the wiring trace rather than to power or ground. Dampening resistors reduce or slow down the high edge rate as well as any reflections. While discrete dampening resistors are often used, the output buffer itself provides some impedance, which also acts as a dampening resistor. Unfortunately, this impedance decreases with higher-current-drive output buffers. The lower impedance of these output buffers creates a greater mis-match between the output buffer's impedance and the impedance of the wiring trace.

Power budgets also limit the quality of termination. Lower-impedance resistors consume much power. CMOS chips driving terminated lines can only sink or source a limited amount of current in the static or D.C. state. The D.C. current specifications of CMOS chips, known as $I_{OL}$ and $I_{OH}$, are usually not large enough for termination resistors smaller than 100 or 50 ohms. Better termination could be obtained if 10 or 20 ohm resistors were used for termination.

FIG. 1 shows a prior-art CMOS output buffer. Signal PUP is raised high to the Vcc power-supply voltage when the output is to be driven high. Pre-driver 20 is a standard CMOS inverter with p-channel transistor 14 and n-channel transistor 16. The high signal on input PUP turns on n-channel transistor 16 but turns off p-channel transistor 14, driving a low voltage (ground) onto node PG. Node PG is the gate of p-channel driver transistor 10, which is turned on, driving the output pad high toward Vcc. Signal NDN is off (high), causing n-pre-driver 22 to drive a low onto node NG, keeping n-channel driver transistor 12 off.

When the output is to be driven low, PUP goes low, causing p-pre-driver 20 to drive node PG high, turning off p-channel driver transistor 10. Signal NDN goes low, causing p-channel transistor 18 in n-pre-driver 22 to turn on, while n-channel transistor 19 is off. The output of n-pre-driver 22, node NG, is driven high, turning on n-channel driver transistor 12. The output pad is then pulled low to ground. The sources of all transistors are connected directly to power or ground, although perhaps a separate ground line within the chip is used for output n-channel driver transistor 10.

FIG. 2 is a diagram of a waveform of a prior-art high-drive output buffer driving a wiring trace on a circuit board. The high current drive of the output buffer produces a high edge rate that rapidly changes the output voltage from ground to the power-supply voltage, Vcc. The high edge rate produces a wave front that travels down the wiring trace and reflects off one or more ends. The reflected wave front then travels back up the wiring trace to the output buffer, and raises the voltage at the output buffer when the reflected wave arrives. The raised voltage is above Vcc and is known as an overshoot. This reflected wave then reverses direction and travels back to the end of the wiring trace, is reflected, and again reaches the output buffer, producing a series of both overshoots and undershoots, known as ringing. Since the reflected wave is dampened and loses energy at each reflection, the amplitude of the ringing gradually decreases. Low-going ringing (undershoot) is caused by a mis-match in impedance. Multiple reflections interfere with each other and cause the ringing.

When the output buffer switches from high to low, another high-edge rate wave travels down the wiring trace and is reflected back, producing undershoot and more ringing. This undershoot can cause ground bounce inside the output buffer's IC.

When the ringing and over/undershoot is large, logic can read a static signal as low when the static signal is actually high. For example, a static 3-volt signal input to another pin of the IC is a high signal, but when the internal ground of the IC bounces up from 0 volt to 2 volt, the static 3-volt signal appears to be a 1-volt signal, a low input. When the input signal is connected to a latch or flip-flop, the false low can be latched in, causing an error. Thus noise is a serious problem.

Several prior-art solutions to these problems are known. For example, Pierce et al., U.S. Pat. No. 5,319,252, assigned to Xilinx Inc. of San Jose, Calif., discloses an output buffer which gradually turns output buffers on and off so that there is no sharp discontinuity in the current flow. The output voltage is fed back to gradually turn off the output buffer at the end of the voltage transition. Lipp in U.S. Pat. No. 5,347,177, discloses a closed-loop trace which is driven by output buffers with level-sensitive impedance control.

What is desired is a control circuit for a CMOS output buffer. It is desired to control the rate that the driver transistors are turned on and off. It is desired to control the gate nodes of the driver transistors by carefully controlling the edge rate of the pre-driver stages. It is desired to provide feedback to the pre-driver stage in an output buffer.

SUMMARY OF THE INVENTION

The inventor has realized that ground and power bounce can be reduced by controlling the rate that the driver transistors are enabled and disabled. The rate can be controlled by control of the pre-driver stages. In particular, the sources of transistors in the pre-driver stage are connected to a p-channel and an n-channel transistor in parallel. Feedback is applied to one of these source-controlling transistors. One of these source-controlling transistors remains enabled at all times, but the transistor limits current through the source, and thus limits the rate of driver enablement. The feedback senses when the driver's gate voltage has changed. Once this gate-voltage change is detected, the feedback enables the second source-controlling transistor so that additional source current is available in the pre-driver stage. This additional source current increases the rate that the driver is enabled. Thus the driver is initially enabled slowly, but later enabled more quickly. This reduces noise and supply/ground bounce because the edge is smoothed.

DETAILED DESCRIPTION

The present invention relates to an improvement in output buffers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
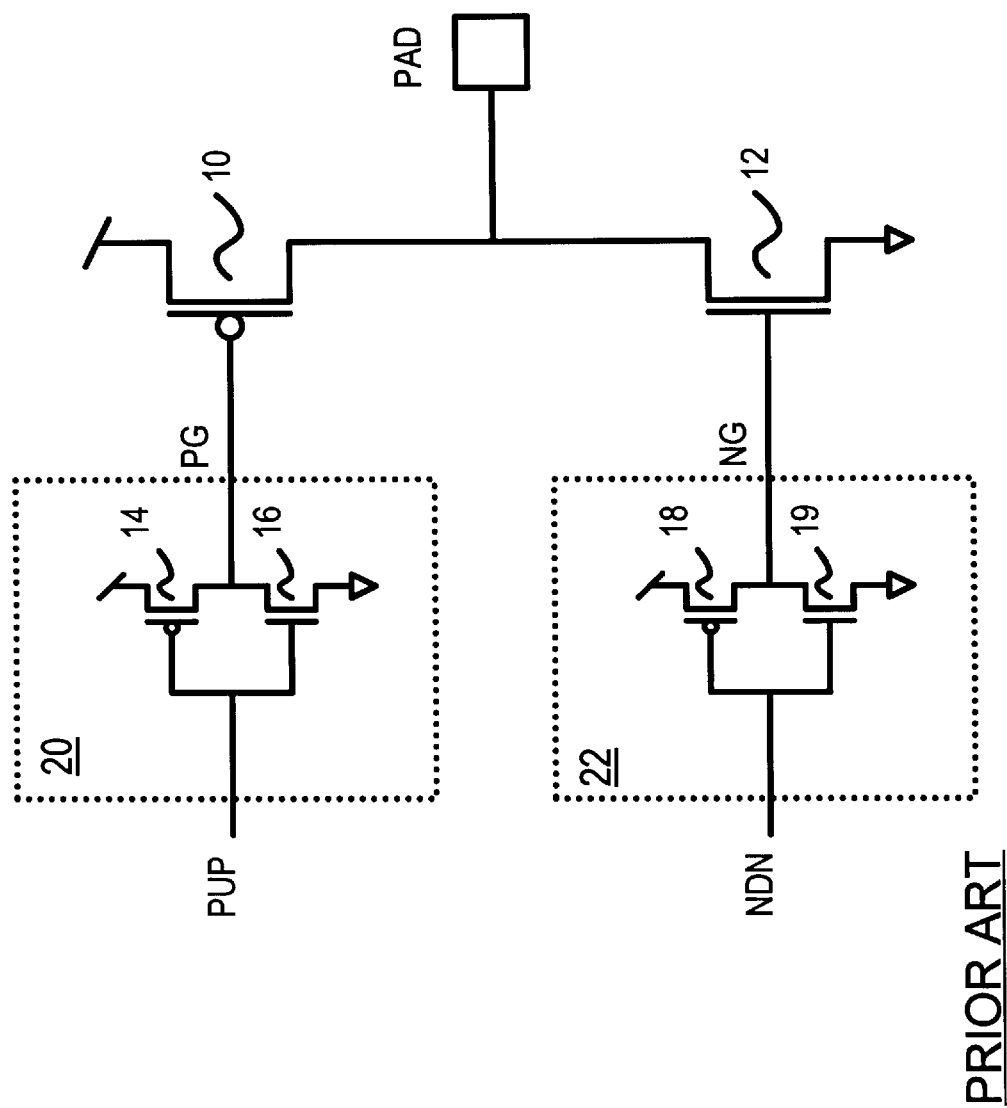
FIG. 1 shows a prior-art CMOS output buffer.
Figure 2:
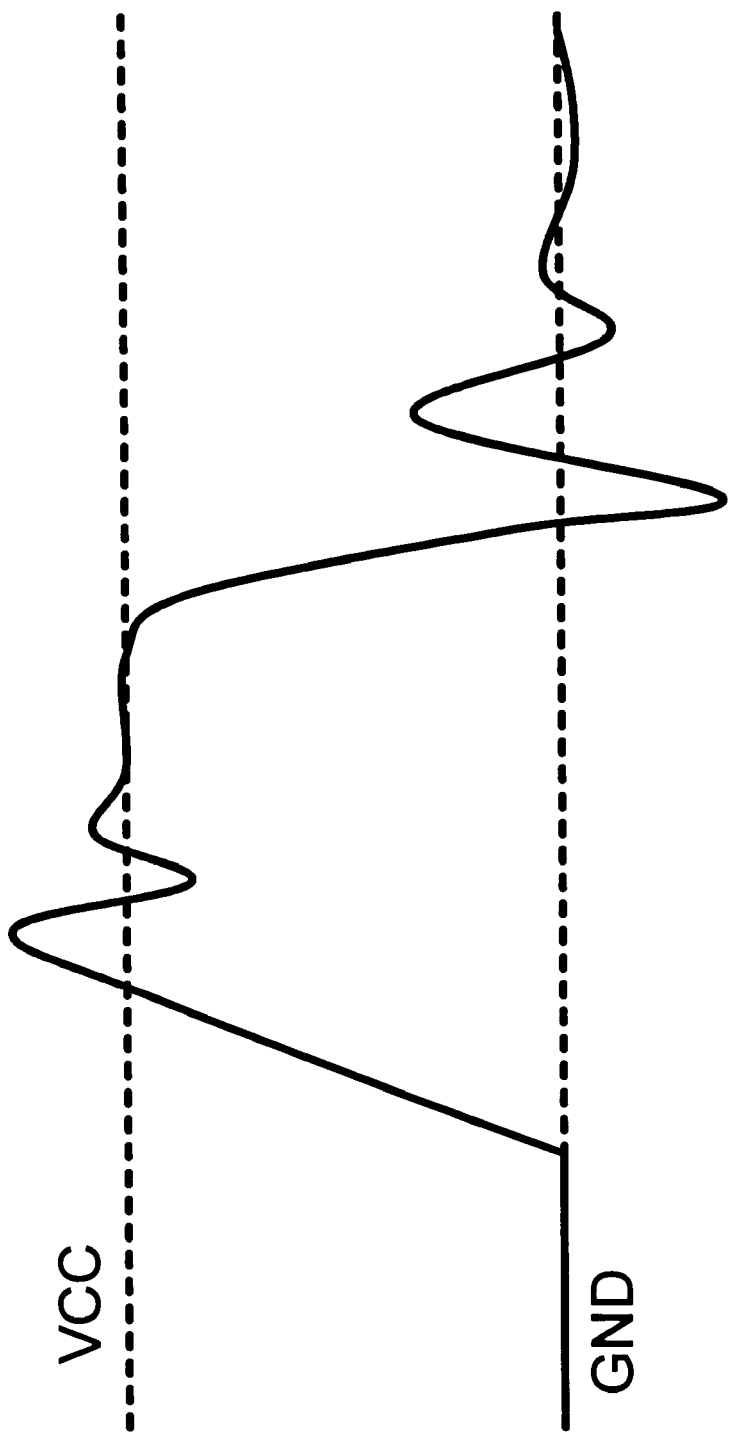
FIG. 2 is a diagram of a waveform of a prior-art high-drive output buffer driving a wiring trace on a circuit board.
Figure 3:
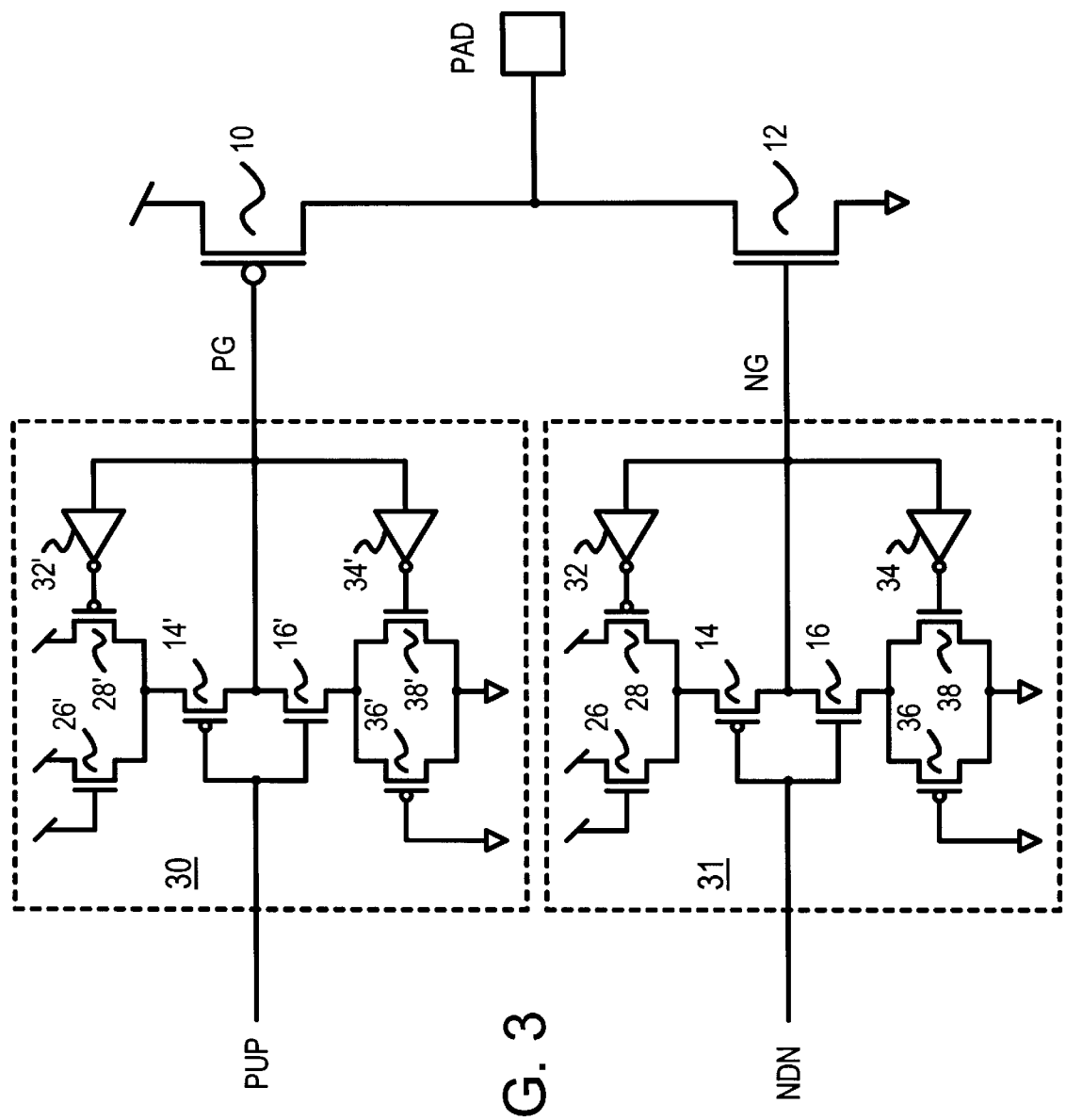
FIG. 3 is a schematic of a low-noise output buffer with parallel source-controlling transistors and feedback control of the sources.

FIG. 3 is a schematic of a low-noise output buffer with parallel source-controlling transistors and feedback control of the sources. Pullup p-channel driver transistor 10 turns on when input signal PUP is high, causing p-pre-driver 30 to drive a low onto driver gate node PG. Pulldown n-channel driver transistor 12 turns on when input signal NDN is low, causing n-pre-driver 31 to drive a high onto driver gate node NG.

PUP and NDN are normally in the same logic state when the output buffer is enabled. The output buffer is disabled (in a high-impedance state) when PUP is low and NDN is high. The condition of PUP high and NDN low is not allowed.

Source control is provided in pre-drivers 30, 31. The pre-drivers can be the same or differ, but in this embodiment are nearly identical, so just pre-driver 31 that drives n-channel driver transistor 12 is described here. Pre-driver 30 operates in a similar manner.

In pre-driver 31, rather than connect the source of n-channel transistor 16 directly to ground, the source connects to ground through p-channel source-controlling transistor 36 and n-channel source-controlling transistor 38. Source-controlling transistors 36, 38 are connected in parallel to each other. The gate of p-channel transistor 36 is connected to ground, so p-channel transistor 36 is always turned on. It provides a limited current to the source of n-channel transistor 16. The gate of n-channel source-controlling transistor 38 is driven by feedback inverter 34 from driver-gate node NG.

Source-control is also provided between the Vcc power supply and the source of p-channel transistor 14. Source-controlling transistors 26, 28 are connected in parallel to each other. The gate of n-channel transistor 26 is connected to Vcc, so n-channel transistor 26 is always turned on. It provides a limited current to the source of p-channel transistor 14. The gate of p-channel source-controlling transistor 28 is driven by feedback inverter 32 from driver-gate node NG.

The sources of transistors 14, 16 are never left floating, since one of the parallel source-controlling transistors is always on. The source of p-channel transistor 14 is always connected to power by n-channel source-controlling transistor 26, which is always on since its gate is connected to power. Likewise, the source of n-channel transistor 16 is always connected to ground by p-channel source-controlling transistor 36, which has its gate connected to ground so that it is always on. Of course, when the source voltage rises to within a threshold of the supply, the always-on transistor stops conducting. The opposite-type transistor in parallel is then fully conducting in its linear region of operation.

The always-on source-controlling transistors are the opposite type usually connected to power or ground. For example, p-channel source-controlling transistor 36 is a p-channel transistor connected to ground, while in standard CMOS n-channel transistors are usually connected to ground. Likewise, n-channel source-controlling transistor 26 is an n-channel transistor connected to power, while in standard CMOS p-channel transistors are usually connected to power. Using opposite-type transistors provides a current-limiting function since the transistors operate with a higher threshold voltage due to the body effect. Toward the end of a transition, the always-on transistor conducts less current as its gate-to-source voltage is reduced.

Operation—FIG. 3

When the output buffer of FIG. 3 transitions from high-to-low, node NG is initially low. Node NG is pulled high gradually to slowly enable driver transistor 12, reducing noise. Input NDN is high at first, but then goes low to switch the output buffer. When NDN goes low, n-channel transistor 16 shuts off while p-channel transistor 14 turns on. However, node NG is still low at first, causing feedback inverter 32 to initially drive a high voltage to the gate of p-channel transistor 28. Thus p-channel transistor 28 is initially off, but n-channel transistor 26 is on. All the current to charge node NG through p-channel transistor 14 must pass through n-channel transistor 26, since p-channel transistor 28 is off. Since only n-channel transistor 26 is on, source current is limited at first. This limited source current in pre-driver 31 slowly charges node NG, the gate of n-channel driver transistor 12. N-channel driver transistor 12 turns on slowly at first, gradually pulling the output pad lower in voltage. Noise is reduced through n-channel driver transistor 12 due to the slow initial charging of its gate node NG.

Once the voltage of gate node NG rises to about half of Vcc, feedback inverter 32 switches, driving a low voltage onto the gate of p-channel transistor 28. This low voltage from feedback inverter 32 turns on p-channel transistor 28. Once p-channel transistor 28 turns on, the source current to p-channel transistor 14 increases, perhaps doubling, since now both source-controlling transistors 26, 28 are conducting. The higher source current allows p-channel transistor 14 to more quickly charge node NG. Node NG rises more quickly in voltage that initially, causing n-channel driver transistor 12 to turn on more quickly than at first. This causes the output pad to be pulled to ground more quickly now.

In a simple analysis, source-controlling transistors 26, 28 can be thought of as providing equal source currents. At the beginning of the transition, only n-channel transistor 26 is on, while at the end of the transition, both transistors 26, 28 are on. Thus the source current that charges the gate node NG is initially only half of the final charging current. This reduced initial current turns on driver transistor 12 slowly at first, but more rapidly later. A shaped output waveform results that produces less ground bounce.

When the output buffer is switched from low to high, input signal NDN is driven high. In pre-driver 31, p-channel transistor 14 turns off, while n-channel transistor 16 turns on. The initial high voltage on node NG causes feedback inverter 34 to drive a low voltage onto the gate of n-channel transistor 38, so that transistor 38 is initially off. However, p-channel transistor 36 is on, providing a limited source current to n-channel transistor 16 to discharge node NG. As the voltage of node NG drops, feedback inverter 34 reaches its threshold and switches, driving a high voltage onto the gate of n-channel transistor 38. The source current is then increased (doubled) as n-channel transistor 38 turns on. The higher source current then allows node NG to be pulled down more quickly. So n-channel driver transistor 12 is turned off slowly at first, but then more quickly. Reduced noise results.

A similar operation occurs for pre-driver 30 when enabling and disabling p-channel driver transistor 10. Node PG is initially charged or discharged slowly with only half the full source current, since only one source-controlling transistor is on. Later, when node PG changes voltage sufficiently to trigger feedback inverters 32', 34', the second source-controlling transistor is turned on, doubling the available source current. Node PG is then switched more rapidly. Since node PG is the gate of p-channel driver transistor 10, the driver transistor is enabled or disabled slowly at first, then more rapidly later. A sharp current change is avoided at the beginning of each transition, reducing di/dt. The lower di/dt produces less resistance to the current-voltage change, with less ground bounce resulting.

Figure 4:
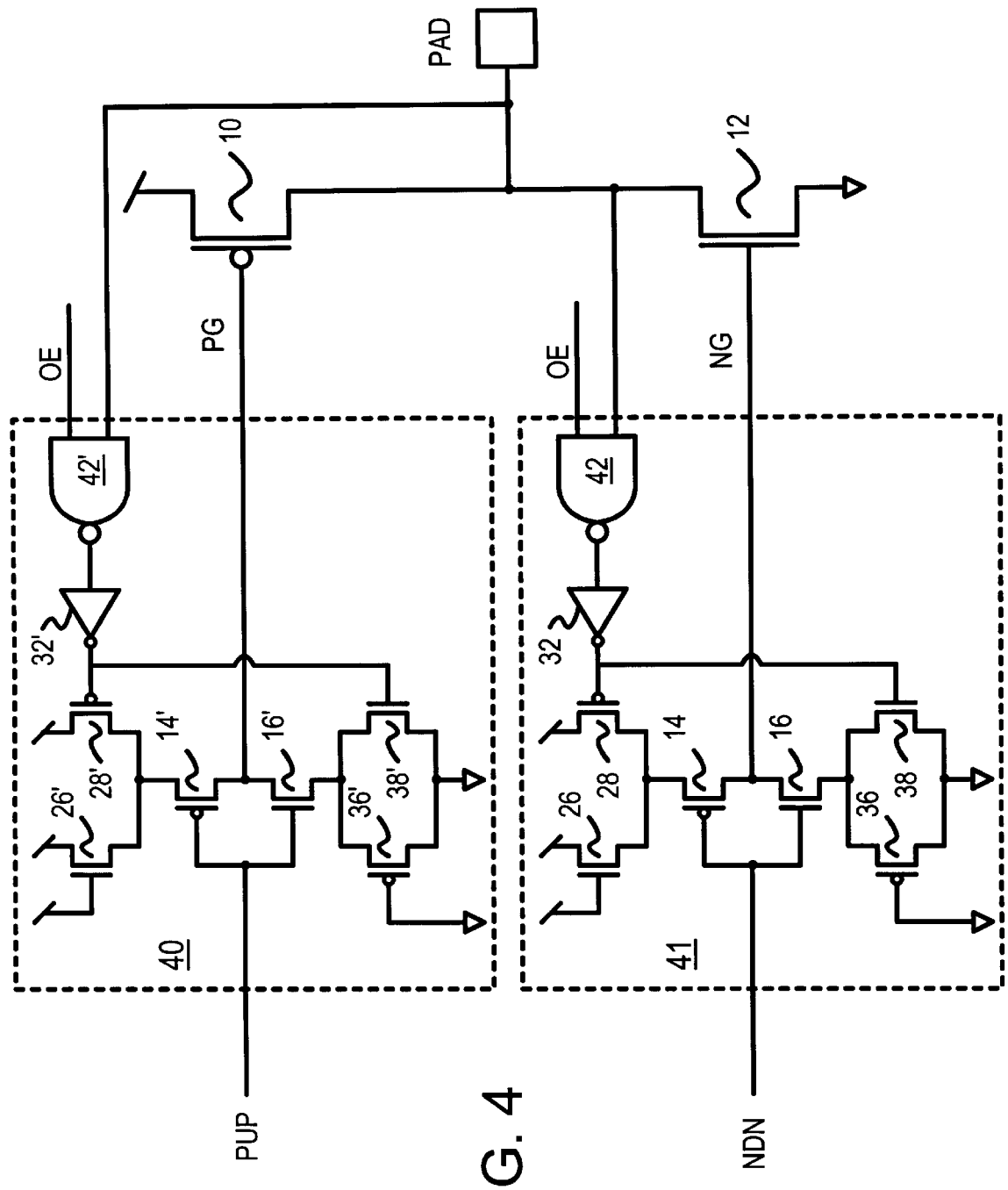
FIG. 4 is a schematic of a low-noise output buffer with parallel source-controlling transistor and feedback from the output pad.

Feedback from Pad—FIG. 4

FIG. 4 is a schematic of a low-noise output buffer with parallel source-controlling transistors and feedback from the output pad. Rather than control the second source transistors with feedback from the driver gate nodes PG, NG, the feedback can be provided directly from the output pad.

Pre-drivers 40, 41 operate in a similar manner to pre-drivers 30, 31 described earlier for FIG. 3, except that feedback to source-controlling transistors 28, 38 is provided from the output pad through NAND gates 42 inverters 32. NAND gates 42 have one input connected to the output pad, and the other input connected to output enable signal OE.

When the output buffer switches, NAND gate 42 waits for node NG or PG to begin turning on or off driver transistors 10, 12 and for the output voltage to swing before switching. Once the output voltage has moved to the threshold of NAND gates 42 (at about half of the transition, to Vcc/2), NAND gates 42 switch, causing inverters 32 to turn on source-controlling transistors 28 or 38, doubling the source current.

By providing feedback from the output pad rather than from the driver-gate nodes PG, NG, an extra delay is introduced into the feedback. This delays the increase of the source current, providing more time to begin the output transition. Also, the timing is adjusted for output (external) loading, since NAND gates 42 wait for the output voltage to reach their switching threshold voltages. When a higher external load causes the output to change more slowly, NAND gates 42 switch later, adjusting the timing of the output buffer. The output waveform can be shaped more exactly for the loading conditions.

However, noise on the output pad from external sources can upset the internal circuit of the output buffer. Thus the embodiment of FIG. 4 is somewhat more risky and uncontrolled than that of FIG. 3 with the internal feedback.

Some of the external noise can be filtered when the output buffer is disabled by driving signal OE low to NAND gates 42. When OE is low, NAND gate 42 outputs a high, which is inverted by inverter 32 to drive a low to the gates of transistors 28, 38. This leaves p-channel transistor 28 on but n-channel transistor 38 off. When OE is low, the output buffer is disabled and neither driver transistor 10, 12 is on. Since the output pad can change state due to external drivers, NAND gate 42 is used to block these transitions from affecting the internal logic when the buffer is disabled. This reduces power drain, since otherwise the gates of transistors 28, 38 would be charged and discharged unnecessarily when the buffer is in the high-impedance state.

Figure 5:
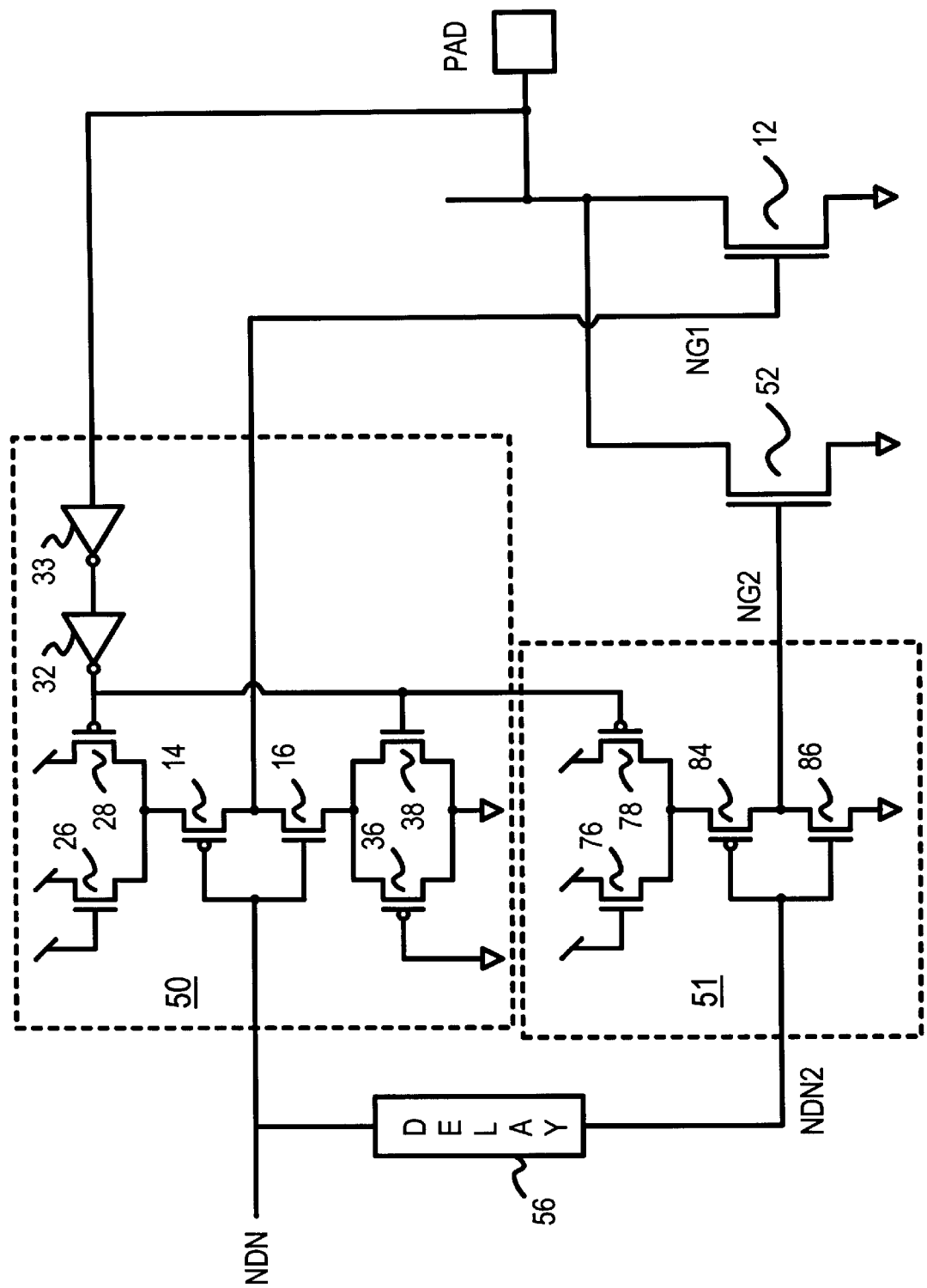
FIG. 5 shows a source-current-controlled output buffer with split pull-down drivers.

Split Drivers—FIG. 5

FIG. 5 shows a source-current-controlled output buffer with split pull-down drivers. Noise can be reduced further by splitting the pull-down driver into two or more transistors that are enabled at different times. This reduces the current surge, since only one of the pull-down driver transistors is enabled at one time.

In FIG. 5, only the pull-down portion of the output buffer is shown. The output pad is pulled low by split n-channel driver transistors 12, 52. When input NDN is switched low, pre-driver 50 drives gate node NG1 high, then after a delay by delay line 56, pre-driver 51 drives node NG2 high. Thus n-channel driver transistor 12 is turned on before n-channel driver transistor 52. N-channel driver transistors 12, 52 can each be one-half the size of the single n-channel driver transistor 12 of FIGS. 3, 4, reducing the initial current surge by half.

When input NDN goes low, p-channel transistor 14 in pre-driver 50 turns on and n-channel transistor 16 turns off. The output pad is initially high, so inverters 33, 32 drive a high onto the gates of transistors 28, 38, 78 turning p-channel transistors 28, 78 off. Thus only n-channel transistor 26 supplies the initial source current that charges node NG1 high. Driver transistor 12 begins to turn on, discharging the output pad.

After a delay by delay line 56, input NDN is also transmitted to pre-driver 51. P-channel transistor 84 in pre-driver 51 turns on and n-channel transistor 86 turns off. The output pad is still high, so inverters 33, 32 drive a high onto the gate of transistor 78, turning p-channel transistor 78 off. Thus only n-channel transistor 76 supplies the initial source current that charges node NG2 high. Driver transistor 52 also begins to turn on, discharging the output pad more rapidly since both driver transistors 12, 52 are now on.

Once the output pad reaches a sufficiently lower voltage, inverters 33, 32 switch, turning on p-channel transistor 28 in pre-driver 50. Then the available source current doubles, charging node NG1 more quickly, which enables driver transistor 12 more quickly. Since inverters 33, 32 are shared by pre-drivers 50, 51, p-channel transistor 78 in pre-driver 51 is also turned on. The available source current from pre-river 51 also doubles, charging node NG2 more quickly, which enables driver transistor 52 more quickly.

Pre-driver 51 does not have source-control on n-channel transistor 86 in this embodiment. N-channel transistor 86 is connected directly to ground, while p-channel transistor 84 is connected to power through source-controlling transistors 76, 78. Such asymmetric source-current control can be applied to any of the pre-drivers when full control of the waveform-shaping is not needed. Sharing of inverters 33, 32 is also shown, but separate feedback could also be implemented. Inverters 33, 32 could also be shared with the pre-driver for the p-channel driver transistor (not shown), and inverter 33 could be replaced with a NAND gate when OE control is also desired.

Figure 6:
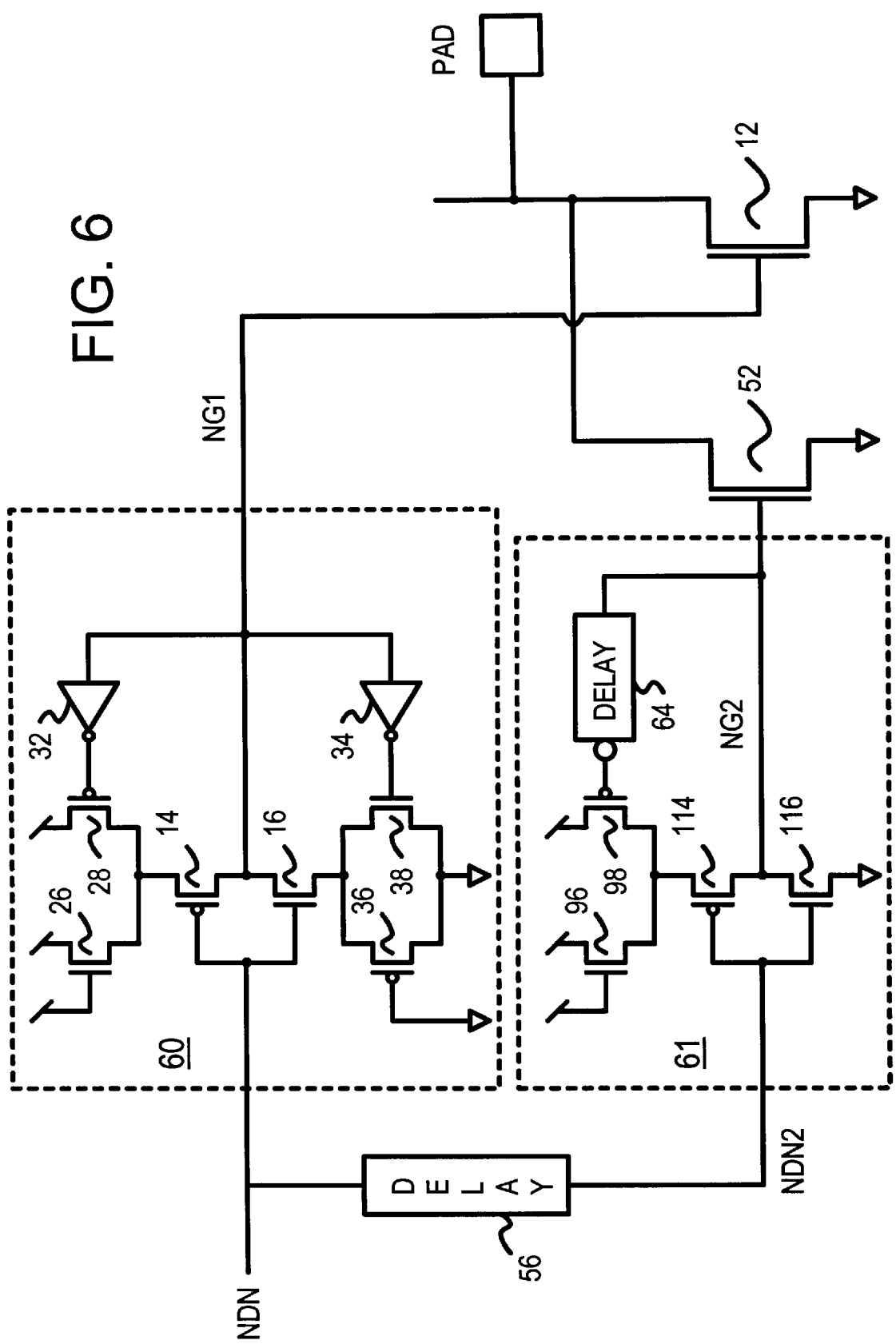
FIG. 6 shows split drivers with internal feedback and adjustable delay.

Split Drivers With Internal Feedback—FIG. 6

FIG. 6 shows split drivers with internal feedback and adjustable delay. Pre-driver 60 uses internal feedback inverters 32, 34 from gate node NG1, while pre-driver 61 uses internal feedback from gate node NG2 through delay line 64. Current surge is reduced since split driver transistors 12, 52 are used.

When input NDN goes low, p-channel transistor 14 in pre-driver 60 turns on and n-channel transistor 16 turns off. Gate node NG1 is initially low, so inverters 32, 34 drive a high onto the gates of transistors 28, 38, turning p-channel transistor 28 off. Thus only n-channel transistor 26 supplies the initial source current that charges node NG1 high. Driver transistor 12 begins to turn on, discharging the output pad.

After a delay by delay line 56, input NDN is also transmitted to pre-driver 61. P-channel transistor 114 in pre-driver 61 turns on and n-channel transistor 116 turns off. Gate node NG2 is still low, so inverting delay line 64 drives a high onto the gate of transistor 98, keeping p-channel transistor 98 off. Thus only n-channel transistor 96 supplies the initial source current that charges node NG2 high. Driver transistor 52 also begins to turn on, discharging the output pad more rapidly since both driver transistors 12, 52 are now on.

Once node NG1 reaches a sufficiently high voltage, inverters 32, 34 switch, turning on p-channel transistor 28 in pre-driver 60. Then the available source current doubles, charging node NG1 more quickly, which enables driver transistor 12 more quickly. Likewise for pre-driver 61, as node NG2 rises, delay line 64 eventually switches, driving a low voltage onto the gate of p-channel transistor 98 in pre-driver 61, turning it on. The available source current from pre-driver 61 also doubles, charging node NG2 more quickly, which enables driver transistor 52 more quickly.

Inverting delay line 64 allows the feedback timing that controls the additional source current from p-channel transistor 98 to be more precisely controlled. Inverting delay line 64 can be a string of inverters or include and R-C delay for better matching.

ADVANTAGES OF THE INVENTION

A source-control circuit reduces noise from a CMOS output buffer. The rate that the driver transistors are turned on and off is controlled. The gate nodes of the driver transistors are carefully controlled by the source-current, because the edge rate of the pre-driver stages is controlled by the source current. Feedback to the pre-driver stage in an output buffer is provided from either the driver-gate node or from the output pad itself.

ALTERNATE EMBODIMENTS

Several other embodiments are contemplated by the inventor. For example the feedback can be modified by active signals such as OE or mode signals, or by adjustable delays. Different device sizes can be used, and each transistor can be constructed from several sections or legs as is common. The circuits shown can be mixed together. For example, source control may only be needed on the pull-down driver, or perhaps only p-channel source control and not n-channel source control. Additional devices can be placed in parallel with the source-controlling transistors, such as resistors. Parasitic components are often present.

Of course, the actual currents provided by source-controlling transistors 26, 28 vary with the voltage of node NG during the transition, and depend on the logic threshold of feedback inverter 32, which can be adjusted. The relative sizes of source-controlling transistors 26, 28 can be adjusted to control the initial and final source currents, and thus control the exact output waveform. Simulations such as SPICE or ASPEC are normally used to precisely determine the currents. Different sizes and conditions can be simulated and the resulting waveforms compared to find the sizes needed to obtain desired waveform.

Separate feedback inverters to the n-channel and p-channel source-controlling transistors allows for the up and down thresholds to be adjusted independently. However, a single feedback inverter can drive both p-channel transistor 28 and n-channel transistor 38. Separate NAND gates and inverters can be used for each of the four source-controls rather than for just 2 as shown in FIG. 4.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A source-current-controlled output buffer comprising:
   a pullup driver transistor, coupled to an output pad, for driving the output pad to higher voltages, the pullup driver transistor being controlled by a first driver-gate node;
   a pulldown driver transistor, coupled to the output pad, for driving the output pad to lower voltages, the pulldown driver transistor being controlled by a second driver-gate node;
   a first pre-driver for driving the first driver-gate node;
   a second pre-driver for driving the second driver-gate node, the second pre-driver being responsive to an input and having:
      a p-channel transistor having a gate coupled to the input, and a drain coupled to the second driver-gate node, and a source coupled to a p-source node;
      an n-channel transistor having a gate coupled to the input, and a drain coupled to the second driver-gate node;
      a fixed source-control transistor, coupled between the p-source node and a power supply, having a gate connected to a fixed voltage that initially enables the fixed source-control transistor; and a feedback source-control transistor, coupled between the p-source node and the power supply, having a gate connected to a feedback signal that switches state during a transition of the output buffer;

a NAND gate, having a first input coupled to the output pad, and a second input being an output-enable signal, for generating an intermediate signal;

a feedback inverter for generating the feedback signal from the intermediate signal, having an input from NAND gate, and an output connected to the gate of the feedback source-control transistor, wherein the fixed source-control transistor provides current through the p-channel transistor to charge the second driver-gate node during an initial part of a transition, but the feedback source-control transistor and the fixed source-control transistor both supply current through the p-channel transistor to charge the second driver-gate node during a final part of the transition, whereby charging of the second driver-gate node is controlled by source current from the second pre-driver.

2. The source-current-controlled output buffer of claim 1 wherein:

the fixed source-control transistor is an n-channel transistor with the gate connected to the power supply as the fixed voltage;

the feedback source-control transistor is a p-channel transistor.

3. The source-current-controlled output buffer of claim 2 wherein the pullup driver transistor is a p-channel transistor and the pulldown driver transistor is an n-channel transistor.

4. The source-current-controlled output buffer of claim 1 wherein the NAND gate has a second input coupled to an output-enable signal, the output-enable signal blocking changes on the output pad from reaching the feedback source-control transistor when the output buffer is not enable.

5. The source-current-controlled output buffer of claim 1 wherein the second pre-driver further comprises:

an n-source node at a source of the n-channel transistor;

a second fixed source-control transistor, coupled between the n-source node and a ground, having a gate connected to a fixed voltage that initially enables the fixed source-control transistor; and a second feedback source-control transistor, coupled between the n-source node and the ground, having a gate connected to a feedback signal that switches state during the transition of the output buffer;

wherein the second fixed source-control transistor provides current through the n-channel transistor to discharge the second driver-gate node during an initial part of a falling transition, but the second feedback source-control transistor and the second fixed source-control transistor both supply current through the n-channel transistor to discharge the second driver-gate node during a final part of the falling transition, whereby discharging and charging of the second driver-gate node is controlled by source current from the second pre-driver.

6. The source-current-controlled output buffer of claim 5 wherein the feedback signal to the feedback source-control transistor is the same signal as the feedback signal to the second feedback source-control transistor.

7. A source-current-controlled output buffer comprising:

a pullup driver transistor, coupled to an output pad, for driving the output pad to higher voltages, the pullup driver transistor being controlled by a first driver-gate node;

a pulldown driver transistor, coupled to the output pad, for driving the output pad to lower voltages, the pulldown driver transistor being controlled by a second driver-gate node;

a first pre-driver for driving the first driver-gate node;

a second pre-driver for driving the second driver-gate node, the second pre-driver being responsive to an input and having:

a p-channel transistor having a gate coupled to the input, and a drain coupled to the second driver-gate node, and a source coupled to a p-source node;

an n-channel transistor having a gate coupled to the input, and a drain coupled to the second driver-gate node;

a fixed source-control transistor, coupled between the R-source node and a power supply, having a gate connected to a fixed voltage that initially enables the fixed source-control transistor, and a feedback source-control transistor, coupled between the p-source node and the power supply, having a gate connected to a feedback signal that switches state during a transition of the output buffer;

an n-source node at a source of the n-channel transistor;

a second fixed source-control transistor, coupled between the n-source node and a ground, having a gate connected to a fixed voltage that initially enables the fixed source-control transistor; and a second feedback source-control transistor, coupled between the n-source node and the ground, having a gate connected to a feedback signal that switches state during the transition of the output buffer;

wherein the feedback signal to the feedback source-control transistor is a different signal from the feedback signal to the second feedback source-control transistor, wherein the second pre-driver further comprises:

a feedback inverter for generating the feedback signal, having an input from the second driver-gate node, and an output connected to the gate of the feedback source-control transistor;

a second feedback inverter for generating the feedback signal to the second feedback source-control transistor, the second feedback inverter having an input from the second driver-gate node, and an output connected to the gate of the second feedback source-control transistor.

8. The source-current-controlled output buffer of claim 7 further comprising:

a second pulldown transistor, being an n-channel transistor coupled to the output pad, for driving the output pad to ground, the second pulldown transistor being controlled by a third driver-gate node;

a third pre-driver for driving the third driver-gate node, the third pre-driver being responsive to a delayed input that is delayed from the input and having:

a p-channel transistor having a gate coupled to the delayed input, and a drain coupled to the third driver-gate node, and a source coupled to a second p-source node;

an n-channel transistor having a gate coupled to the delayed input, and a drain coupled to the third driver-gate node;

a fixed source-control n-channel transistor, coupled between the second p-source node and the power supply, having a gate connected to the power supply; and a feedback source-control p-channel transistor, coupled between the second p-source node and the power supply, having a gate connected to a feedback signal that switches state during a transition of the output buffer;

whereby the second pulldown transistor is enabled after the pulldown driver transistor is enabled.

9. An output buffer comprising:

an output;

an n-channel driver transistor coupled between the output and a ground, for connecting the output to ground in response to its gate being connected to an n-gate node;

a p-channel driver transistor coupled between the output and a power supply, for connecting the output to the power supply in response to its gate being connected to a p-gate node;

a first pre-driver, responsive to an input, for driving the n-gate node with a shaped waveform, the first pre-driver including:

a first p-channel transistor having a gate connected to the input and a drain connected to the n-gate node, with a source connected to an upper source node;

an upper n-channel source-control transistor, having a gate connected to the power supply, for supplying a first upper-source current to the upper source node from the power supply;

an upper p-channel source-control transistor, having a gate connected to an upper feedback signal, for supplying a second upper-source current to the upper source node in response to the upper feedback signal;

a first n-channel transistor having a gate connected to the input and a drain connected to the n-gate node, with a source connected to a lower source node;

a lower p-channel source-control transistor, having a gate connected to the ground, for supplying a first lower-source current to the lower source node from the ground; and a lower n-channel source-control transistor, having a gate connected to a lower feedback signal, for supplying a second lower-source current to the lower source node in response to the lower feedback signal;

a logic gate, having a first input coupled to the output, for generating the upper feedback signal, wherein the logic gate is a NAND gate and an inverter, wherein a second input to the NAND gate is an output-enable signal;

wherein the upper feedback signal and the lower feedback signal are driven low during a transition in which the output is driven low, but driven high during a transition in which the output is driven high, the upper feedback signal causing the second upper-source current to accelerate charging of the n-gate node, the lower feedback signal causing the second lower-source current to accelerate discharging of the negate node, whereby source current in the first pre-driver controls a rate of charging and discharging of the n-gate node of the n-channel driver transistor.

10. The output buffer of claim 9 wherein the lower feedback signal is the same signal as the upper feedback signal.

11. The output buffer of claim 9 wherein the first pre-driver further comprises:

lower feedback inverter, having an input from the n-gate node, for generating the lower feedback signal.

12. The output buffer of claim 9 further comprising:

a second pre-driver, responsive to an input, for driving the p-gate node with a shaped waveform, the second pre-driver including:

a second p-channel transistor having a gate connected to the input and a drain connected to the p-gate node, with a source connected to a second upper source node;

a second upper n-channel source-control transistor, having a gate connected to the power supply, for supplying a first upper-source current to the second upper source node from the power supply;

a second upper p-channel source-control transistor, having a gate connected to a second upper feedback signal, for supplying a second upper-source current to the second upper source node in response to the second upper feedback signal;

a second n-channel transistor having a gate connected to the input and a drain connected to the p-gate node, with a source connected to a second lower source node;

a second lower p-channel source-control transistor, having a gate connected to the ground, for supplying a first lower-source current to the second lower source node from the ground; and a second lower n-channel source-control transistor, having a gate connected to a second lower feedback signal, for supplying a second lower-source current to the second lower source node in response to the second lower feedback signal;

wherein the second upper feedback signal and the second lower feedback signal are driven low during a transition in which the output is driven low, but driven high during a transition in which the output is driven high, the second upper feedback signal causing the second upper-source current to accelerate charging of the p-gate node, the second lower feedback signal causing the second lower-source current to accelerate discharging of the p-gate node, whereby source current in the second pre-driver controls a rate of charging and discharging of the p-gate node of the p-channel driver transistor.

13. A reduced-noise output buffer comprising: an output;

first pull-down driver means for conducting current from the output to a ground in response to a voltage at a first gate node;

first pre-driver means for driving the first gate node with a charging current, the first pre-driver means having:

p-channel transistor means, having a gate controlled by an input indicating when the output is to be switched, for conducting current from the first gate node to an upper node;

upper n-channel fixed transistor means, having a gate coupled to a power supply, for conducting an upper-source current from the power supply to the upper node;

upper p-channel feedback transistor means, having a gate coupled to an upper feedback node, for conducting an additional upper-source current from the power supply to the upper node;

feedback means for generating a feedback signal to the upper feedback node, the feedback signal switching state to indicate when the additional upper-source current is to also charge the first gate node;

n-channel transistor means, having a gate controlled by the input indicating when the output is to be switched, for conducting current from the first gate node to a lower node;

lower p-channel fixed transistor means, having a gate coupled to the ground, for conducting a lower-source current from the lower node to the ground;

lower n-channel feedback transistor means, having a gate coupled to a lower feedback node, for conducting an additional lower-source current from the lower node to the ground;

second pull-down driver means, for also conducting current from the output to the ground in response to a second gate node;

delay means, receiving the input indicating when the output is to be switched, for generating a delayed input:

second pre-driver means for driving the second gate node with a charging current, the second pre-driver means having:

second p-channel transistor means, having a gate controlled by the delayed input, for conducting current from the second gate node to a second upper node;

second upper n-channel fixed transistor means, having a gate coupled to the power supply, for conducting a second upper-source current from the power supply to the second upper node;

second upper p-channel feedback transistor means, having a gate coupled to a second upper feedback node, for conducting an additional second upper-source current from the power supply to the second upper node;

second n-channel transistor means, having a gate controlled by the delayed input, conducting current from the second gate node to the ground; and second feedback means for generating a feedback signal to the second upper feedback node, the feedback signal switching state to indicate when the additional second upper-source current is to also charge the second gate node.

14. The reduced-noise output buffer of claim 13 wherein the first pull-down driver means comprises an n-channel transistor and wherein the feedback means is an inverter with an input coupled to the first gate node.

* * * * *